(12) United States Patent
Weekly

(10) Patent No.: US 6,885,098 B2
(45) Date of Patent: Apr. 26, 2005

(54) ROUTING FOR MULTILAYER CERAMIC SUBSTRATES TO REDUCE EXCESSIVE VIA DEPTH

(75) Inventor: Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/408,485

(22) Filed: Apr. 7, 2003

(65) Prior Publication Data

US 2003/0170977 A1 Sep. 11, 2003

Related U.S. Application Data

(62) Division of application No. 09/637,315, filed on Aug. 10, 2000, now Pat. No. 6,617,243.

(51) Int. Cl.[7] .............................................. H01L 23/053
(52) U.S. Cl. ...................... 257/700; 257/701; 257/703; 257/774; 257/758
(58) Field of Search .......................... 25/700, 701, 774, 25/758, 703; 257/700, 701, 703, 774, 758; 29/829, 852, 853; 174/262

(56) References Cited

U.S. PATENT DOCUMENTS

| | | | |
|---|---|---|---|
| 4,443,278 A | | 4/1984 | Zingher |
| 5,302,219 A | | 4/1994 | Hargis |
| 5,686,764 A | * | 11/1997 | Fulcher ....................... 257/778 |
| 5,861,670 A | * | 1/1999 | Akasaki ...................... 257/737 |
| 5,914,533 A | * | 6/1999 | Frech et al. ................. 257/700 |
| 5,946,552 A | * | 8/1999 | Bird et al. ................... 438/107 |
| 6,021,564 A | | 2/2000 | Hanson |

OTHER PUBLICATIONS

U. Ghoshal, *Static ZT–Meter for Screening TE Samples*, IBM Research, Austin Research Laboratory, Austin, TX 78758, two pages.

* cited by examiner

*Primary Examiner*—Nitin Parekh
(74) *Attorney, Agent, or Firm*—Sawyer Law Group LLP

(57) ABSTRACT

Aspects for routing in multilayer ceramic substrates that reduces via depth and avoids via bulge are described. The aspects include providing a multilayer ceramic substrate with at least two redistribution layers. Vias for each of a plurality of signal lines are jogged on at least a second redistribution layer of the at least two redistribution layers. Further, the aspects include providing the second redistribution layer no more than seven layers deep in the multilayer ceramic substrate.

7 Claims, 12 Drawing Sheets

US 6,885,098 B2

ROUTING FOR MULTILAYER CERAMIC SUBSTRATES TO REDUCE EXCESSIVE VIA DEPTH

This is a division of application Ser. No. 09/637,315 filed on Aug. 10, 2000, now U.S. Pat. No. 6,617,243.

FIELD OF THE INVENTION

The present invention relates to multilayer ceramic substrate carriers with routing that reduces via depth and avoids via-bulge.

BACKGROUND OF THE INVENTION

Controlled collapse chip connection (C4) or flip-chip technology has been successfully used for over twenty years for interconnecting high I/O (input/output) count and area array solder bumps on silicon chips to base ceramic chip carriers, for example alumina carriers. In C4 technology or flip chip packaging, one or more integrated circuit chips are mounted above a single or multiple layer ceramic (MLC) substrate or board, and pads on the chip(s) are electrically or mechanically connected to corresponding pads on the other substrate by a plurality of electrical connections, such as solder bumps.

In MLC packages, a ceramic substrate is the platform upon which chips, passive components, protective lids, and thermal enhancement hardware are attached according to well known techniques. Wiring patterns within the substrate carrier define escape paths in single chip modules (SCMs) and multichip modules (MCMs), transforming the tight I/O pitch at the die level of the chips to a workable pitch at the board level. The wiring pattern also establishes the modules' power distribution network. Vertical metal vias provide interconnections between the various layers within the MLC. C4 pads can be directly soldered onto MLC vias, providing low inductance, direct feed to power and ground planes.

Planarity of the chip attach surface of substrates/carriers is important in order to reliably mount chips via the C4 process to their carriers. One aspect contributing to the non-uniformity of the carrier surface is related to a condition referred to as via-bulge. During firing, the expansion/contraction of the typical conductive paste is not the same as that for the typical dielectric material encompassing the vias and etch lines. Therefore, vias which protrude from the surface and that go into the substrate through many layers will tend to form hills on the carrier's mounting surface, i.e., will produce via-bulge.

Accordingly, what is needed is an approach to routing signal lines that substantially eliminates excessive via depth for high C4 density MLC substrates. The present invention addresses such a need.

SUMMARY OF THE INVENTION

The present invention provides aspects for routing in multilayer ceramic substrates that reduces via depth and avoids via bulge. The aspects include providing a multilayer ceramic substrate with at least two redistribution layers. Vias for each of a plurality of signal lines are jogged on at least a second redistribution layer of the at least two redistribution layers. Further, the aspects include providing the second redistribution layer no more than seven layers deep in the multilayer ceramic substrate.

With the present invention, the ability to increase signal density on chips interfacing to ceramic substrates without causing problems with planarity of the mounting surface is achieved by limiting the depth of vias which go to the chip mounting surface of the substrate. In addition, through the present invention, substrate designs, which have had to move to either a higher cost substrate dielectric, and/or to a tighter C4/via pitch, are able to be produced with reduced cost. Further, the present invention allows for about a ⅓ increase in signal density, while still maintaining a high power to signal ratio as compared to a typical interstitial C4 pattern. These and other advantages of the aspects of the present invention will be more fully understood in conjunction with the following detailed description and accompanying drawings.

DETAILED DESCRIPTION OF THE INVENTION

The present invention relates to multilayer ceramic substrate carriers with routing that reduces via depth and avoids via-bulge. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

Figure 1:
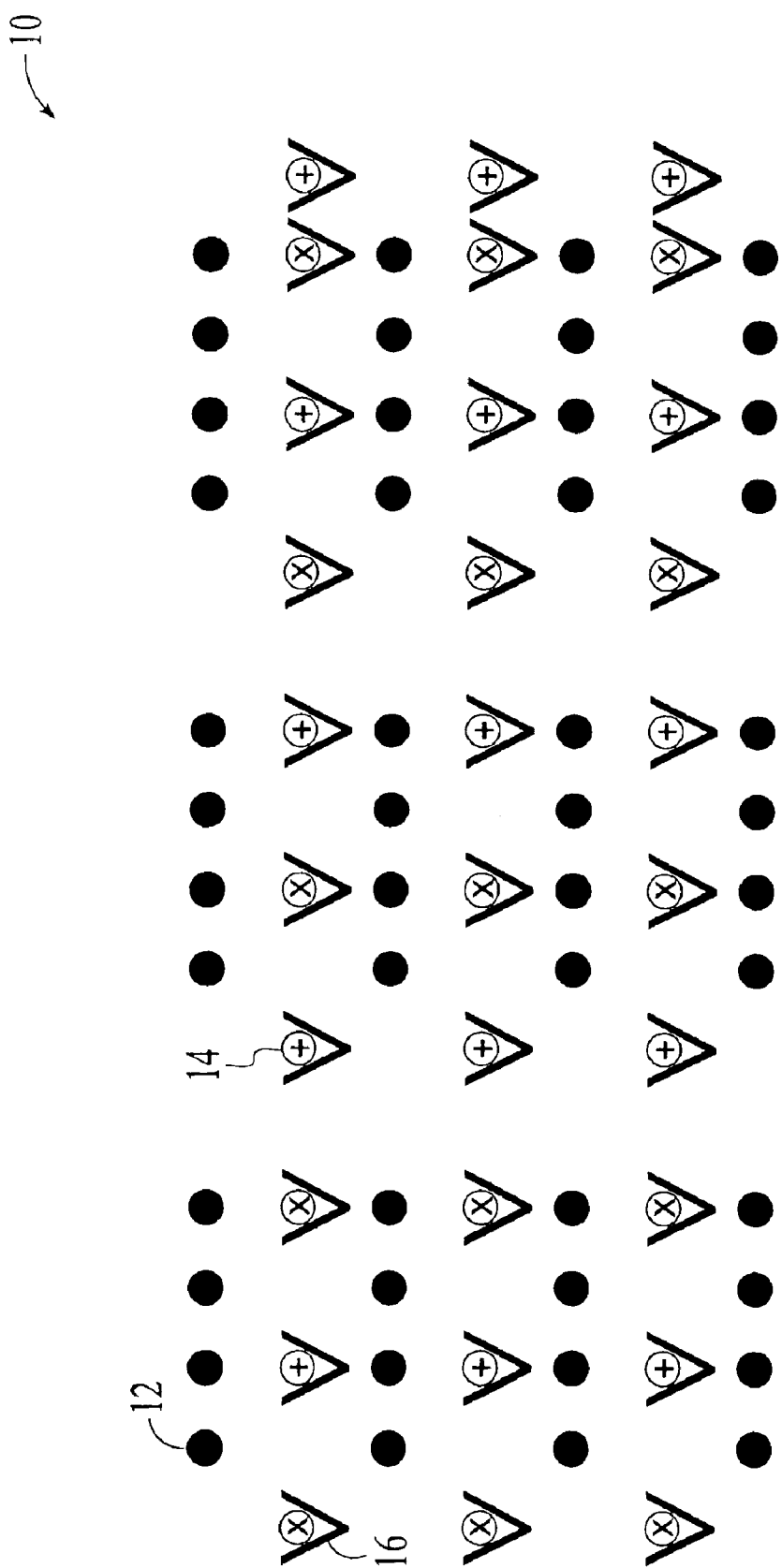
FIG. 1 illustrates a top view of an MLC substrate in accordance with the present invention.

FIG. 1 illustrates a top view of an MLC substrate 10 with a 3×12 array of signal, power, and ground, lines. In the illustrations, the signal lines are designated by solid circles, e.g. circle 12, the power lines are designated by circles with a "+", e.g., circle 14, and the ground lines are designated by circles with an "x", e.g., circles 16. The power and ground structure circles marked with a "v" indicate vias that connect the displayed layer with the layer directly below. The routing of the signal lines in MLC substrate 10 is presented with reference to an overall cross-sectional diagram in FIG. 2. Top views of an etch surface of individual layers are presented in order in FIGS. 3, 4, 5, 6, 7, 8, 9, 10, 11, and 12, which illustrate a power and ground structure for a single supply system which would provide a high power/ground to signal ratio for C4s and vias at each layer in accordance with the present invention.

Figure 2:
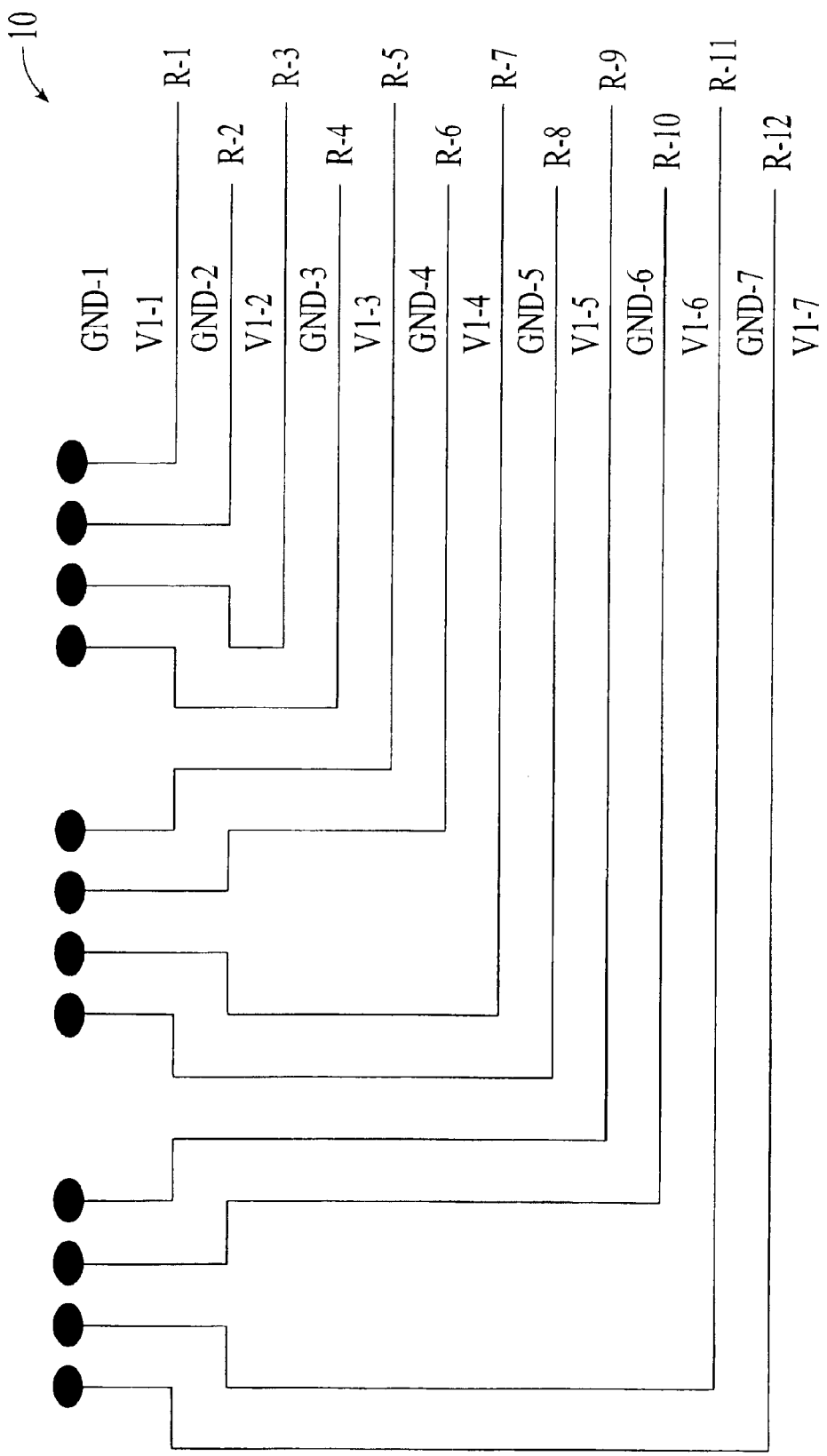
FIG. 2 illustrates a partial cross-section of the MLC substrate of FIG. 1 showing signal line jogging.

Referring now to FIG. 2, routing of twelve signal lines through the layers of the MLC substrate 10 is illustrated. The sequence of layers is formed through standard techniques and includes: GND-1, a first ground layer; V1-1, a first power layer; R-1, a first redistribution layer; GND-2, a second ground layer; R-2, a second redistribution layer; V1-2, a second power layer; R-3, a third redistribution layer; GND-3, a third ground layer; R-4, a fourth redistribution layer; V1-3, a third power layer; R-5, a fifth redistribution layer; GND-4, a fourth ground layer; R-6, a sixth redistribution layer; V1-4, a fourth power layer; R-7, a seventh redistribution layer; GND-5, a fifth ground layer; R-8, an eighth redistribution layer; V1-5, a fifth voltage layer; R-9, a ninth redistribution layer; GND-6, a sixth ground layer; R-10, a tenth redistribution layer; V1-6, a sixth power layer; R-11, an eleventh redistribution layer; GND-7, a seventh ground layer; R-12, a twelfth redistribution layer; and V1-7, a seventh power layer. While twenty-six layers are represented in FIG. 2, one or two through via layers may exist over the GND-1 layer, as is well appreciated by those skilled in the art.

In accordance with the present invention, as shown in the routing methodology of FIG. 2, all signal line wiring is deflected, i.e., all signal lines are jogged, in at least the R-2 layer, which preferably lies five to no more than seven layers deep, depending upon how many through via layers are desired for the design right under the top surface. Preferably, all power signals jog on GND-1, which would limit the depth of these vias to 2 to 3 layers. The via jogs on R-1 and R-2 layers keep the via depth from the top surface to a minimum in the chosen arrangement where the signals are all routed to the right. Notice that half of the signals have some wrong way wiring required to be able to produce the preferred via jogs in the R-1 or R-2 layer. The routing below the R-2 layer is shown for illustration of one suitable arrangement. Below the R-2 layer, the signals can be routed as they traditionally have been, restricted by adjacent vias and etch only, as is well understood to those skilled in the art.

Figure 3:
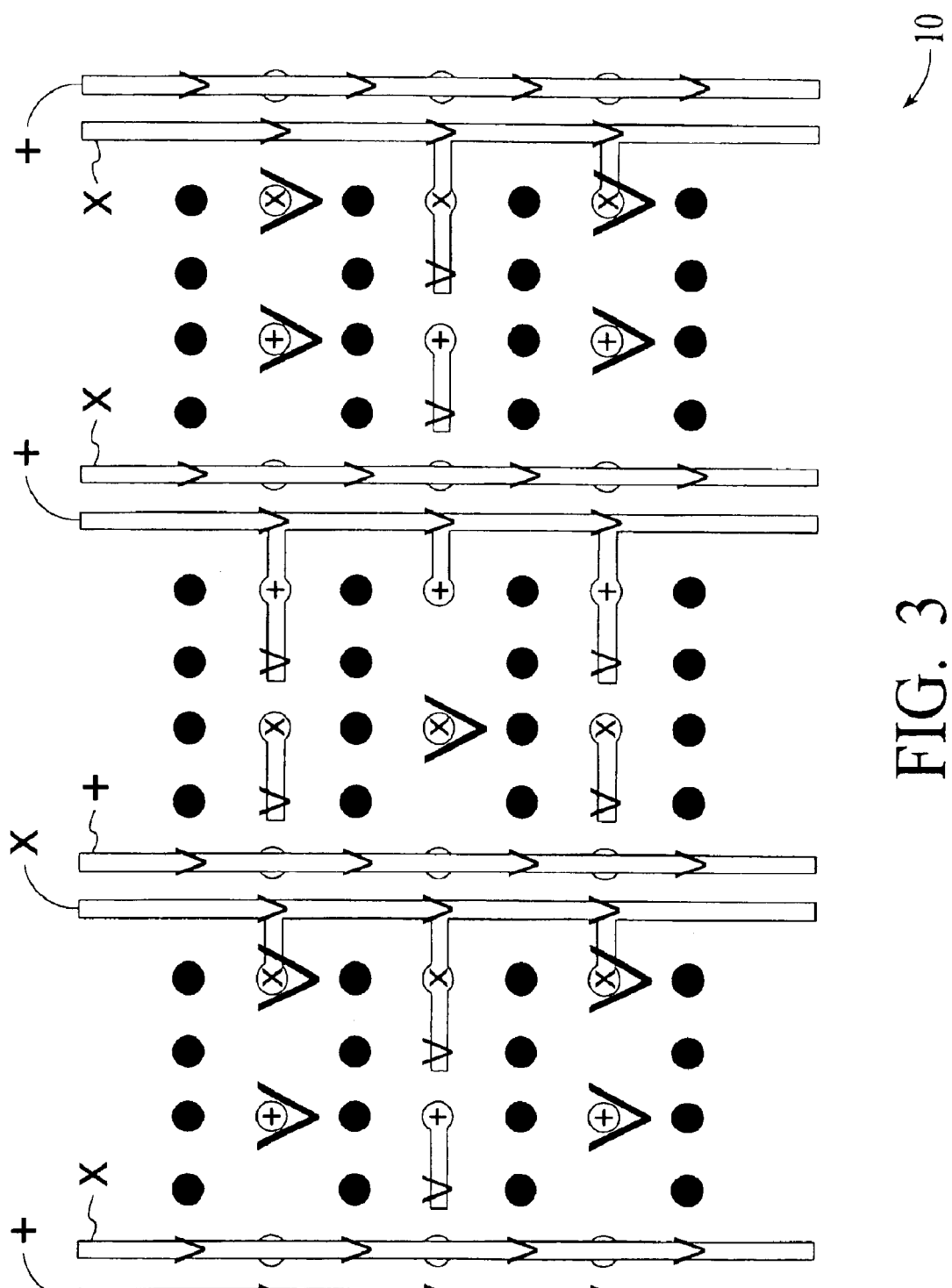
FIGS. 3, 4, 5, 6, 7, 8, 9, 10, 11, and 12 illustrate top views of individual layers of the MLC substrate of FIG. 1.

A top view of the GND-1 layer is shown in FIG. 3. For the illustration shown in FIG. 3, and in FIGS. 4, 5, 6, 7, 8, 9, 10, 11, and 12, for the power and ground structures, a circle represents a via which connects the displayed layer with that above it, while a "v" represents a via which connects the displayed layer with that below it. For the signal nets, a rectangle indicates the jogs, with a rectangle end designated with a "v" representing a spot where a via goes from the displayed layer to one below it, a circle with no rectangle associated with it represents a via that goes to layers above and below, and a circle at the end of a rectangle represents a via coming from an above layer to terminate on that displayed.

Figure 4:
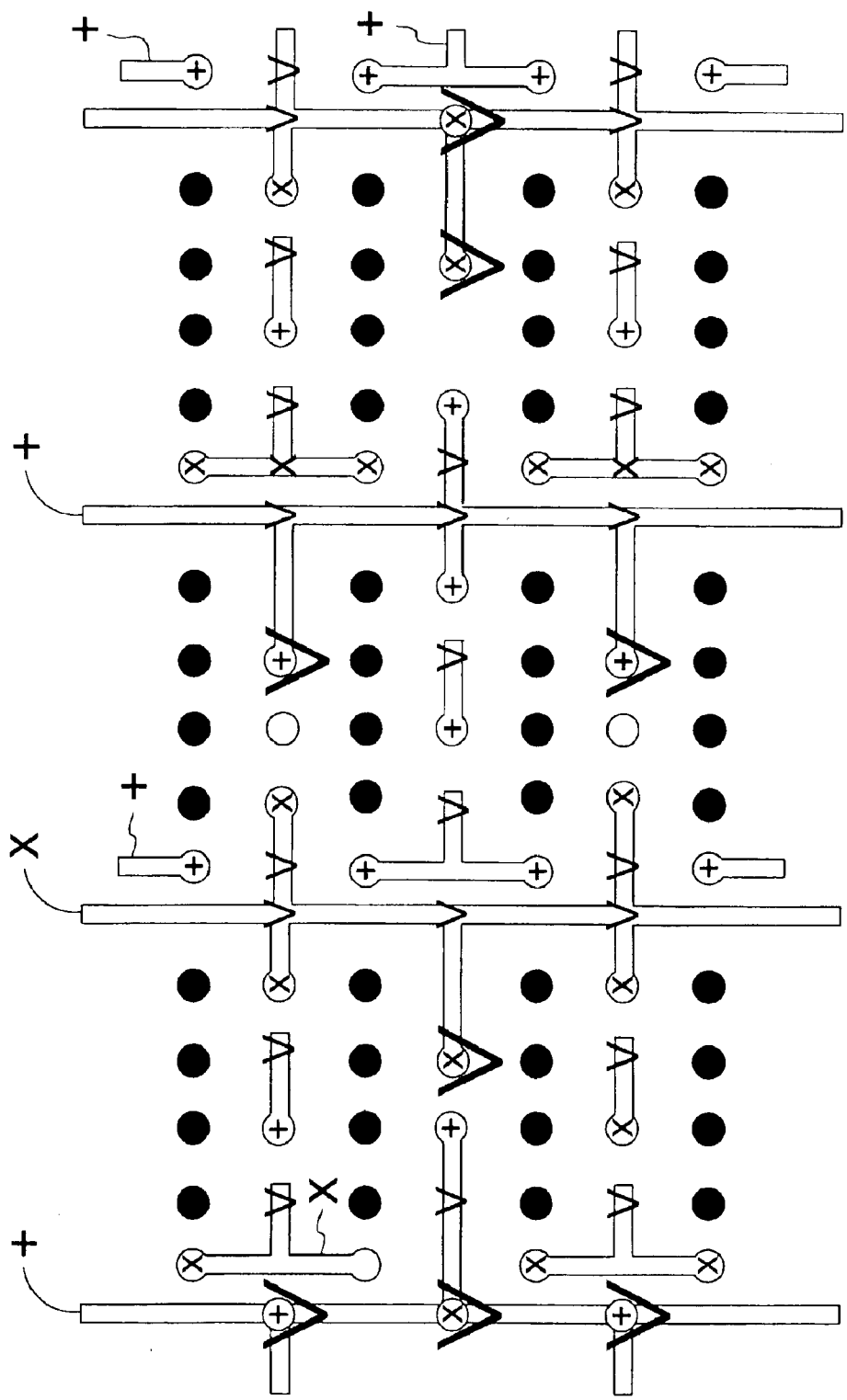
Figure 5:
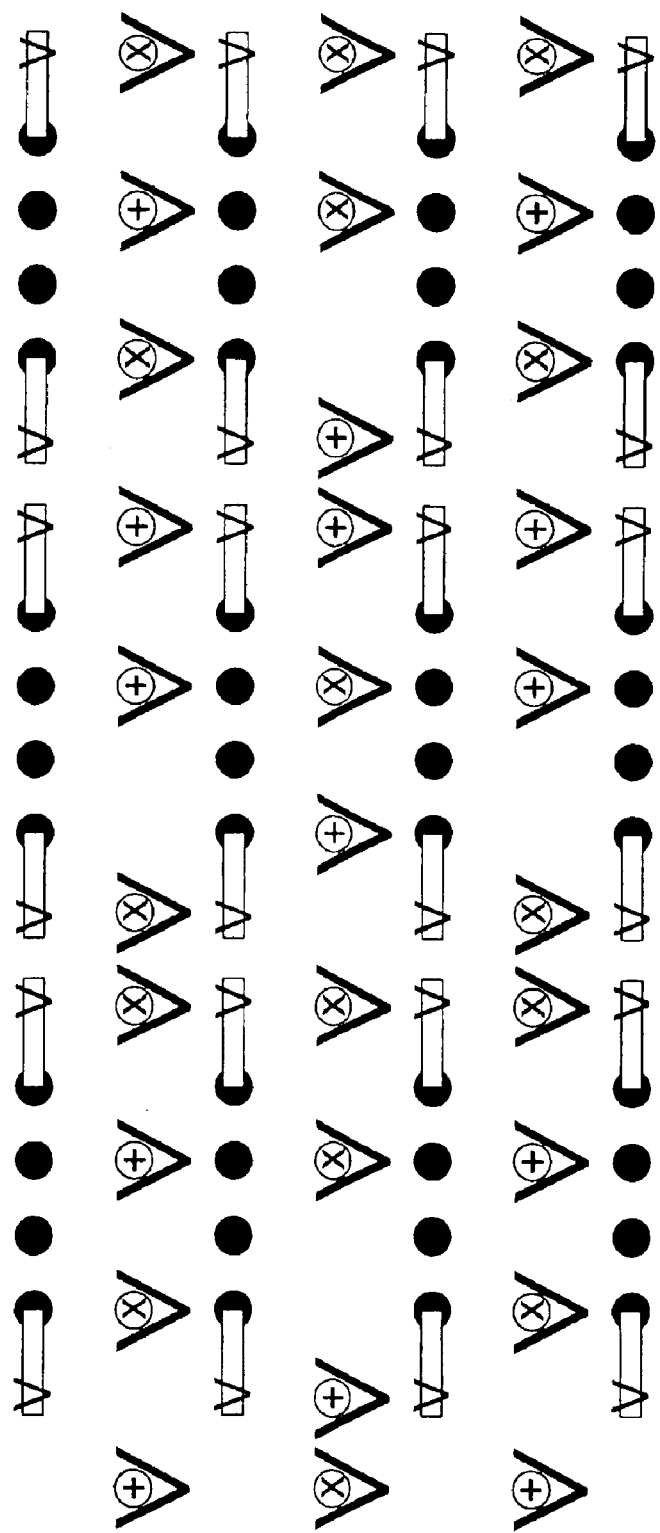
Figure 6:
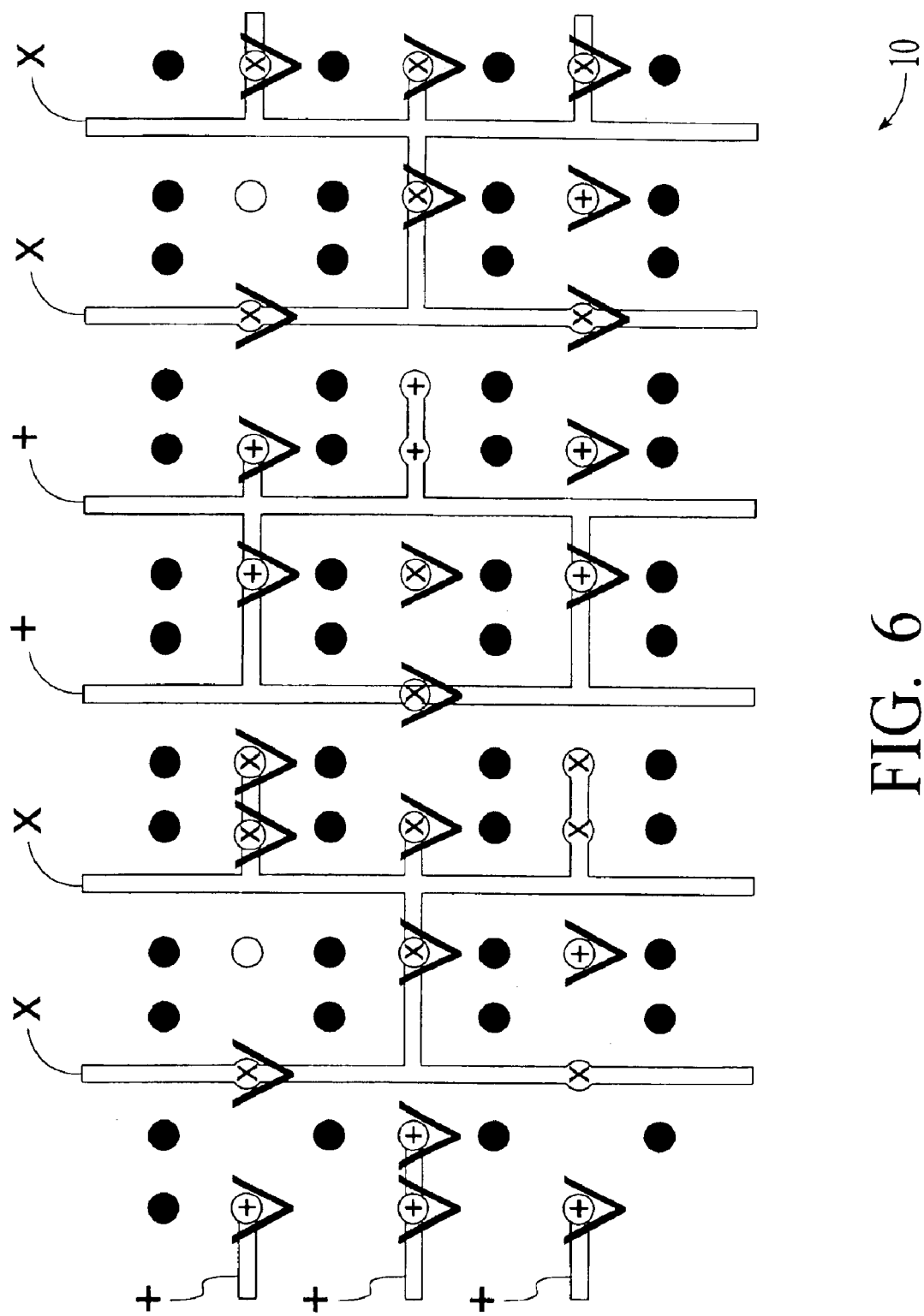
Figure 7:
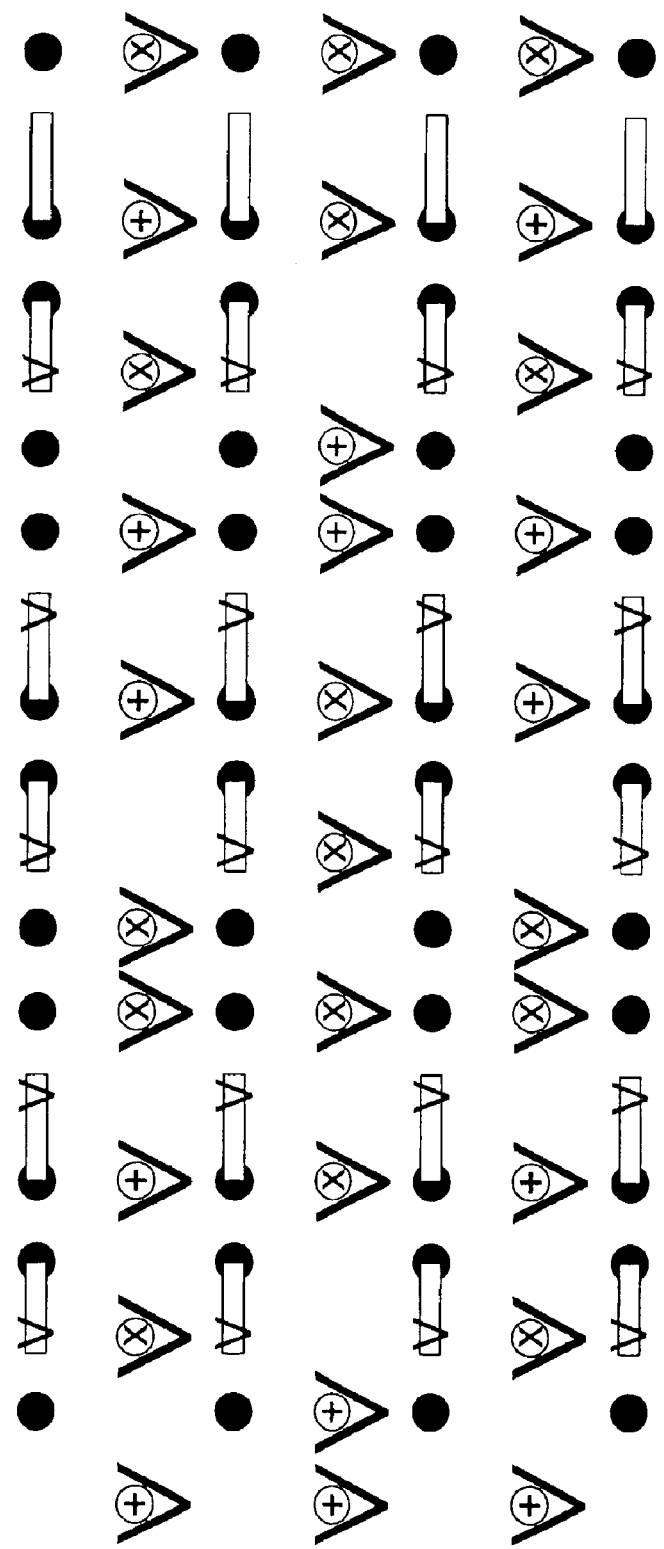
Figure 8:
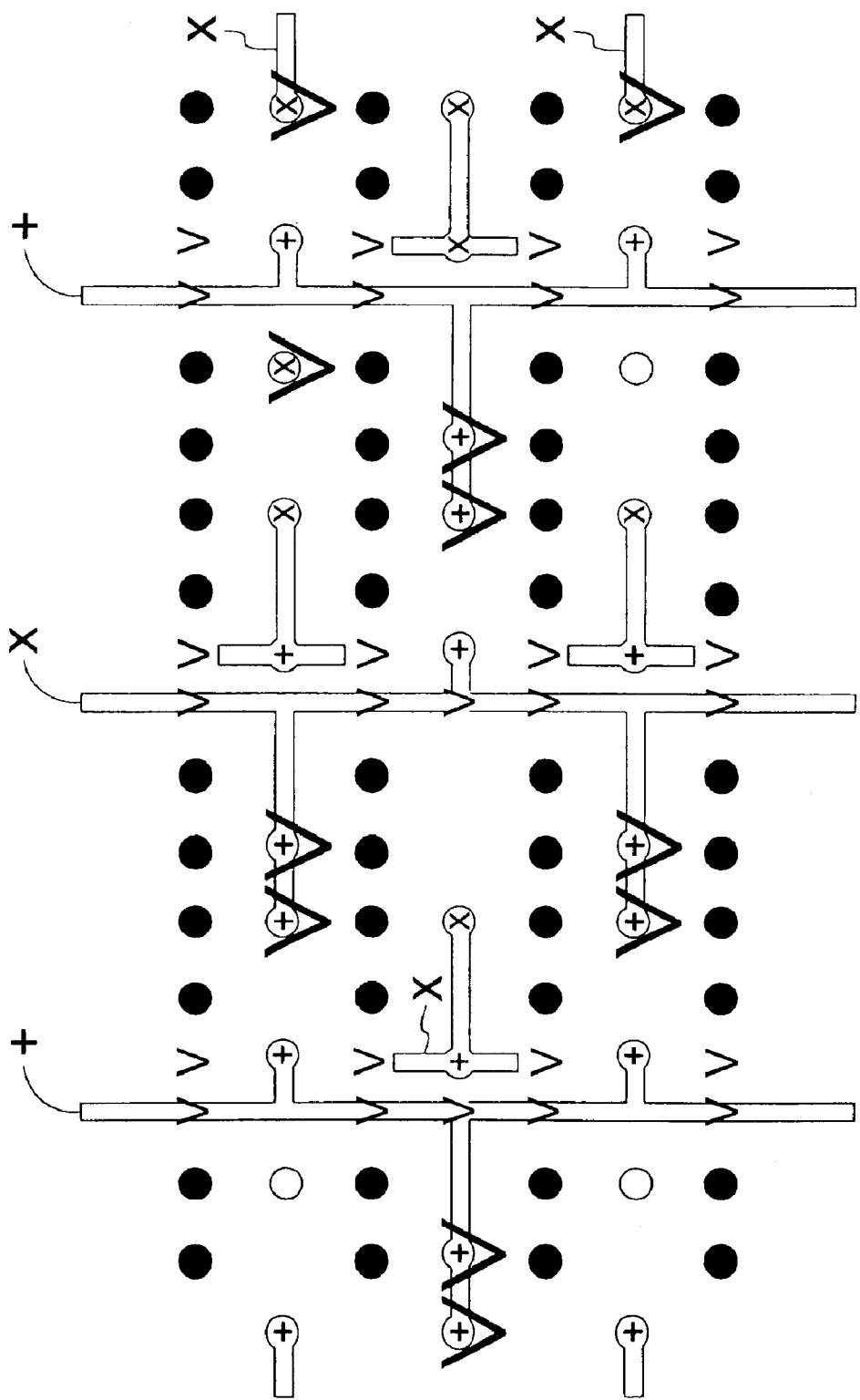
Figure 9:
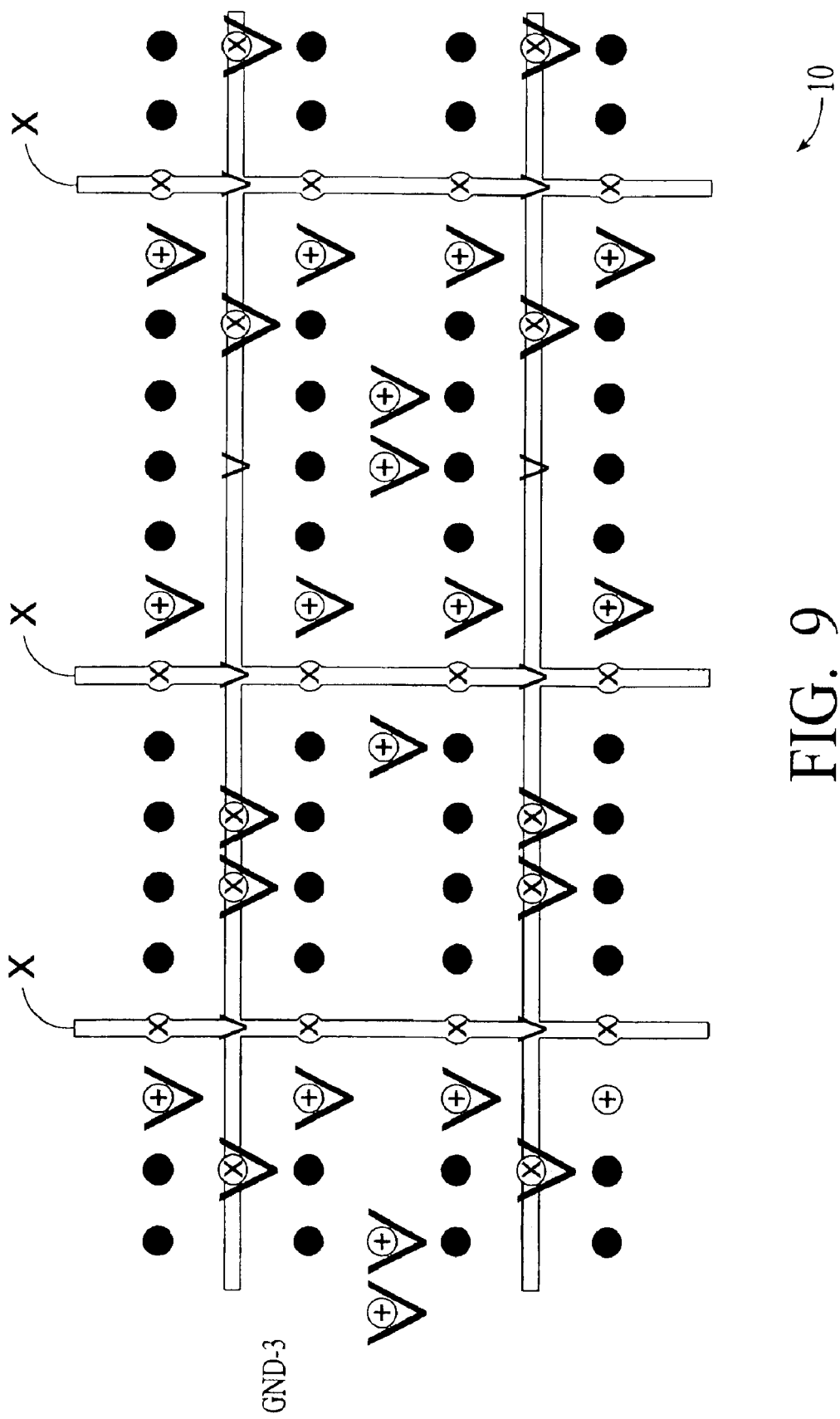
Figure 10:
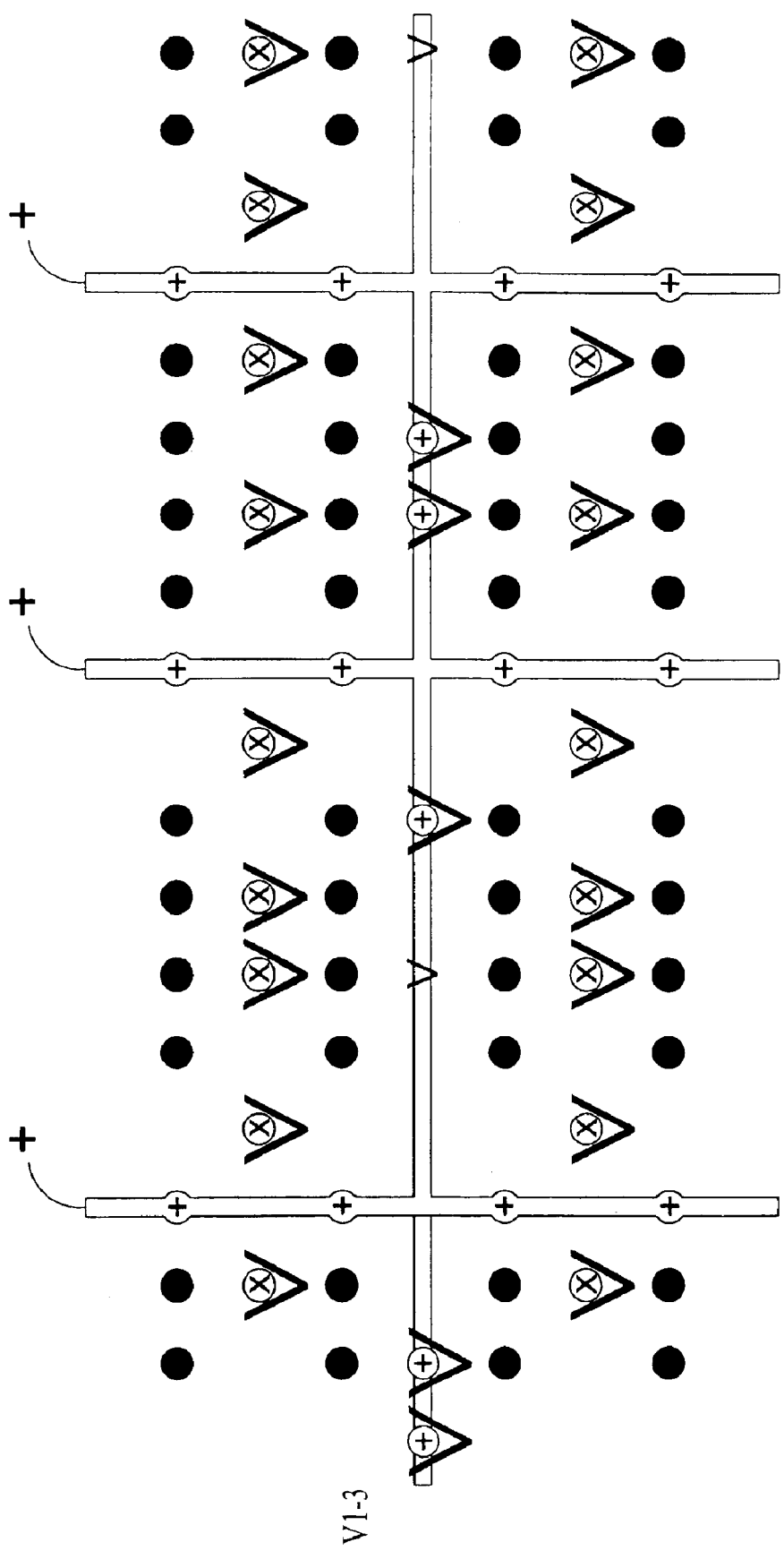
Figure 11:
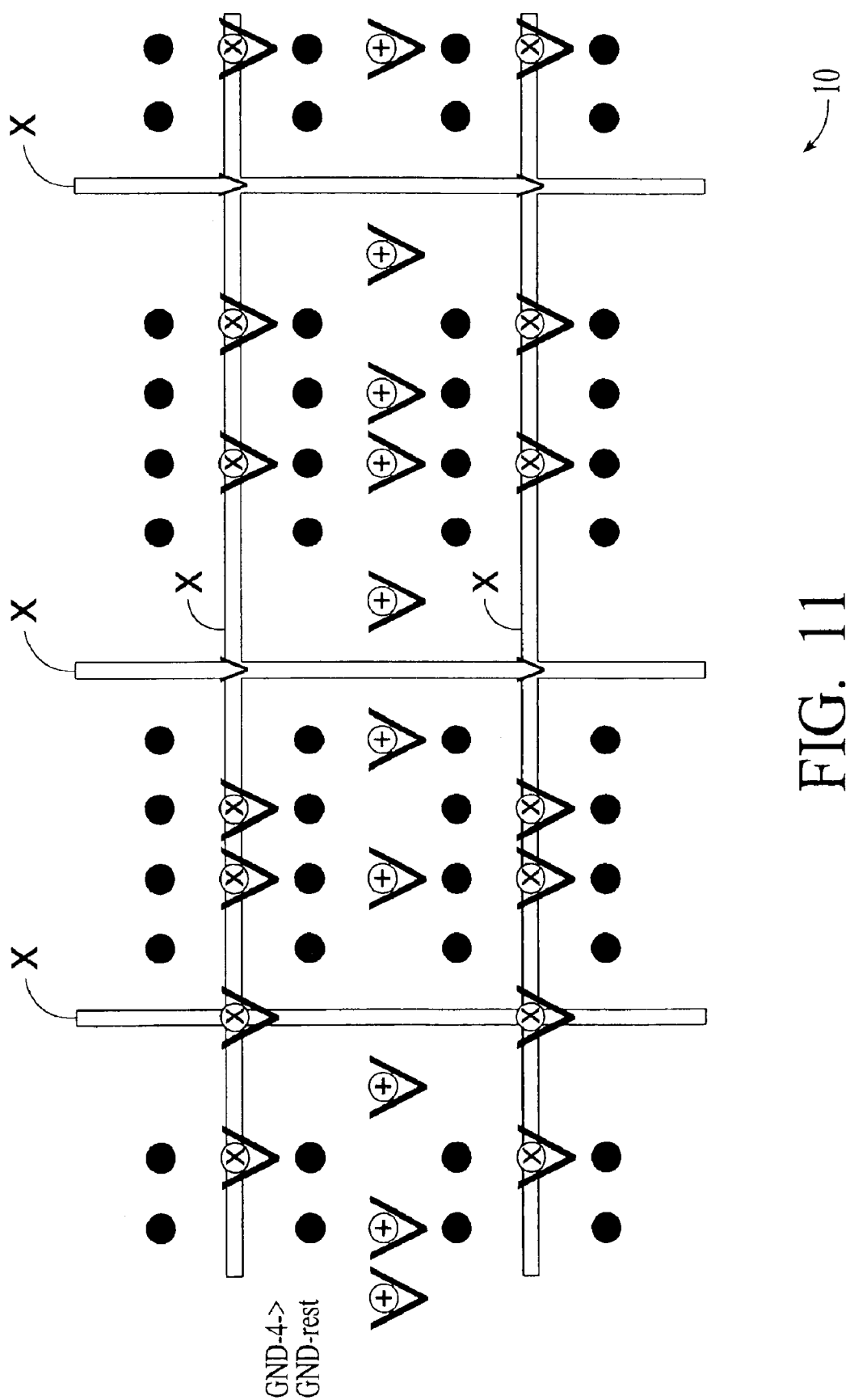
Figure 12:
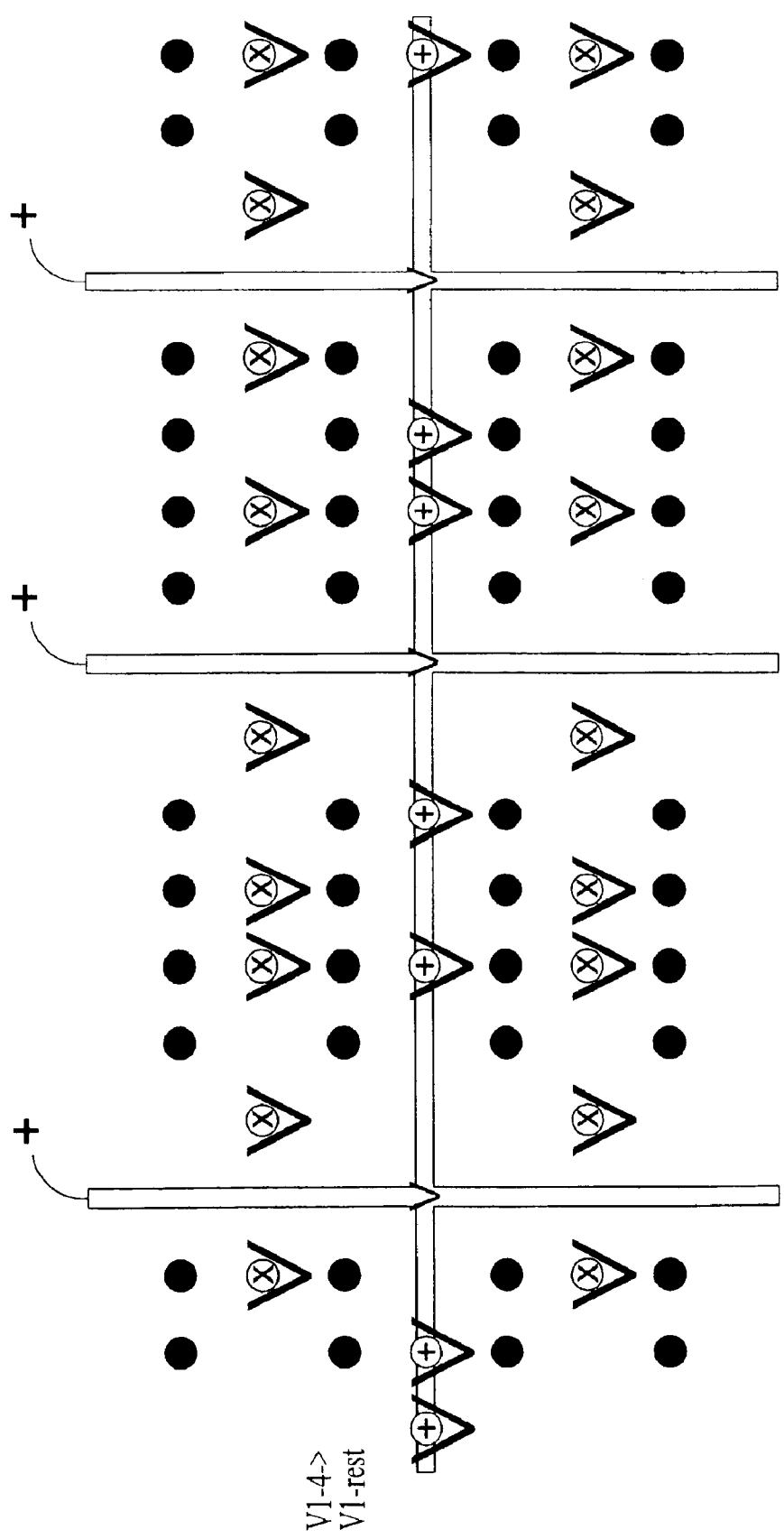

As shown by FIG. 3, in the first ground layer, GND-1, the signal lines go to the layer below, i.e., the first power layer, V1-1, shown in FIG. 4. In FIG. 4, all of the signal lines go to the layer below, i.e., the first redistribution layer, R-1, which is shown in FIG. 5. In correspondence with the signal line jogging represented in the cross-sectional diagram of FIG. 2, the first and last signal lines of each set of four signal lines jog in the first redistribution layer R-1. In the next layer, the second ground layer GND-2 of FIG. 6, the signal lines pass through to the next layer, the second redistribution layer R-2, shown in FIG. 7. The rectangles of FIG. 7 indicate the jogging of the signal lines not jogged in the first redistribution layer R-1 (FIG. 4).

As mentioned previously, below the R-2 layer, the signals can be routed as they traditionally have been, restricted by adjacent vias and etch only, as is well understood to those skilled in the art. Thus, the top views of the remaining redistribution layers of FIG. 2 have not been included as individual figures. However, in order to further demonstrate the high power to signal ratio afforded by the routing methodology of the present invention, FIGS. 8, 9, 10, 11, and 12 are included to illustrate exemplary ground and power structures for the second power layer, V1-2, (FIG. 8), the third ground layer, GND-3, (FIG. 9), the third power layer, V1-3, (FIG. 10), the fourth ground layer and all remaining ground layers, GND-4->GND-rest, (FIG. 11), and the fourth power layer and all remaining power layers, V1-4->V1-rest, (FIG. 12), as is well appreciated by those skilled in the art.

It should be further appreciated that as the signals break out, the power and ground meshes could translate to a more conventional mesh/via structure outside of the area of high signal via density. Additionally, although only a 3×12 array of signals was illustrated, this pattern can be repeated in both dimensions to affect much larger areas. Also, the pattern presented herein can be merged with other patterns on a chip image where other conditions may dictate different power/ ground to signal ratios. If required, the power/ground via density can be improved over the illustration by adding vias between the layers at locations where etch and vias do not interfere. For example, in the V1-3 and V1-4>V1-rest layers, additional power vias may be placed at grid locations along the horizontal power etch line where they would not interfere with the vertical ground etch lines on the GND-3 and GND-4>GND-rest layers.

Although the figures illustrate the condition where the fan-out of the signals was done to the right, the pattern aspects accommodate fan-out in other directions. For example, vertical fan-out could be accomplished by jogging the power/ground vias to clear channels between ground GND planes and between power V1 planes. Further, variants of this power/ground via structure in the lower layers would allow clear channels to fan-out signals at even higher routing densities if power/ground distribution is not a driving design issue.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A integrated circuit carrier apparatus with reduced signal via depth, the apparatus comprising:

a multilayer ceramic substrate including at least a first and a second redistribution layer; and a plurality of signal lines routed within the multilayer ceramic substrates by vias jogging in one of the first and second redistribution layers, wherein via-bulge at a surface of the multilayer ceramic substrate is avoided.

2. The apparatus of claim 1 wherein the second redistribution layer comprises a layer no more than seven layers deep in the multilayer ceramic substrate.

3. The apparatus of claim 2 wherein the second redistribution layer comprises a fifth layer.

4. The apparatus of claim 1 wherein the multilayer ceramic substrate further comprises a sequence of layers where a first layer comprises a ground layer, a second layer comprises a power layer, a third layer comprises the first redistribution layer, a fourth layer comprises a second ground layer, and a fifth layer comprises the second redistribution layer.

5. The apparatus of claim 4 wherein the multilayer ceramic substrate further comprises up to two through via layers above the first layer.

6. The apparatus of claim 1 wherein a first half of the plurality of signal lines jog on the first redistribution layer.

7. The apparatus of claim 6 wherein a second half of the plurality of signal lines jog on the second redistribution layer.

* * * * *